Aug. 24, 1954 W. VAN B. ROBERTS 2,687,514

TWO-BAND TUNING NETWORK

Filed Aug. 27, 1948

INVENTOR
WALTER VAN B. ROBERTS
BY Philip G. Cooper
ATTORNEY

Patented Aug. 24, 1954

2,687,514

UNITED STATES PATENT OFFICE 2,687,514

TWO-BAND TUNING NETWORK

Walter Van B. Roberts, Princeton, N. J., assignor to Radio Corporation of America, a corporation of Delaware Application August 27, 1948, Serial No. 46,436

4 Claims. (Cl. 333—76)

This invention relates to high frequency tuning networks and particularly to a network, including two tuned circuits which may be made to respond alternatively to waves of selected frequency within two separated frequency ranges.

It is frequently desirable to tune a radio receiver to one or the other of two separated frequency ranges. For example, thirteen channels have been allocated for television broadcasting purposes which, at the present time, are located in the two frequency ranges extending from 44 to 88 megacycles (mc.) and 174 to 216 mc. Thus, a television receiver must be tunable within two widely separated high frequency ranges. It is also very desirable that the receiver be tunable by a single tuning control means. Furthermore, a well designed high frequency receiver should not have switches or sliding contacts in its tuning network because they are a source of erratic operation for high frequency currents in view of the fact that the contact impedance may vary, and for other reasons which are well known.

It is an object of the present invention, therefore, to provide a novel tuning network, including two resonant circuits, which may be made to resonate alternatively at desired frequencies within two separated frequency ranges.

A further object of the invention is to provide a two band tuning network which may be tuned by a single tuning control means to at least one selected frequency within either one of its two frequency bands without requiring switches within the tuning network.

A two band tuning network in accordance with the present invention comprises two coils having associated therewith at least one capacitance element. The capacitance element or elements and the coils form two resonant circuits such as two parallel resonant circuits or one parallel resonant circuit and a series resonant circuit. A single paramagnetic core is provided which is movable selectively with respect to one or the other one of the two coils to tune the network to the desired frequency within one or the other of two separated frequency ranges. The tuning network of the invention may be utilized between a radio frequency amplifier stage and a converter stage of a superheterodyne receiver, in which case the capacitance elements may include or consist of the interelectrode capacitances of the associated tubes.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
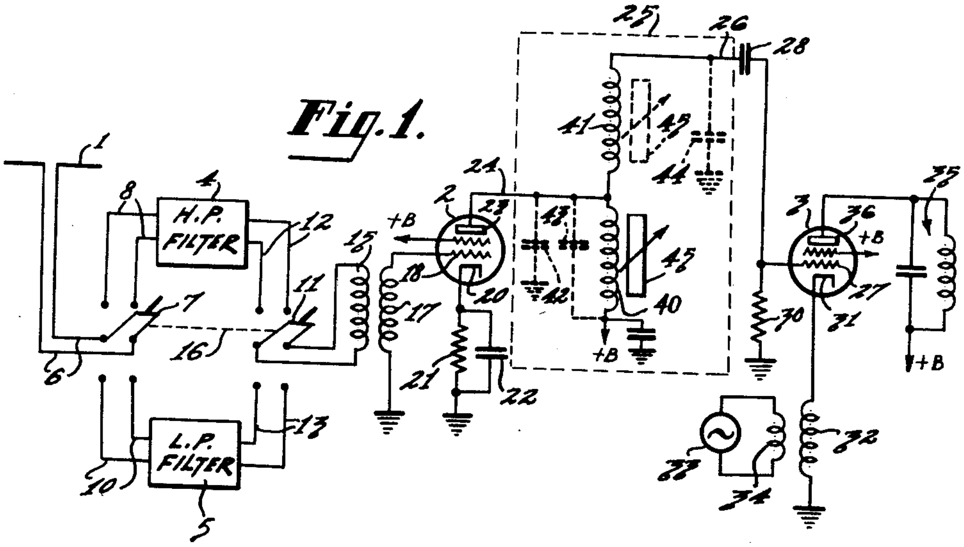
Fig. 1 is a circuit diagram of a portion of a superheterodyne receiver including the tuning network of the invention.

Referring now to Fig. 1 the invention is illustrated by showing its use in an otherwise conventional receiver. Briefly, the receiver comprises antenna 1 which is selectively coupled to RF amplifier 2 by either high pass filter 4 or by low pass filter 5. To this end antenna 1 is connected through transmission line 6, which may be a parallel wire line, to double-pole double-throw switch 7. Leads 8 and 10 connect the free terminals of switch 7 to high pass filter 4 and low pass filter 5 respectively. Another double-pole double-throw switch 11 connects selectively the output leads 12 of high pass filter 4 or the output leads 13 of low pass filter 5 across primary coil 15. Switches 7 and 11 preferably are ganged as indicated at 16. Accordingly, by throwing switches 7 and 11 either high pass filter 4 or low pass filter 5 may be connected between antenna 1 and primary coil 15. Switches 7 and 11 are not detrimental to the operation of a high frequency receiver because they are provided in the low impedance path of the receiver between antenna 1 and RF amplifier 2.

Secondary coil 17 is inductively coupled to primary coil 15 and has one terminal connected to ground and its other terminal conected to control grid 18 of RF amplifier 2. The cathode 20 of amplifier 2 is connected to ground through cathode resistor 21 bypassed by capacitor 22. Amplifier 2 may be a screen grid tube as illustrated. Anode 23 of amplifier 2 is connected to output lead 24 which in turn is connected to tuning network 25 wherein resides the invention herein claimed. Tuning network 25 is preferably designed to pass carrier waves within a low frequency range, for example, between 44 and 88 mc., and within a high frequency range between 174 and 216 mc., for example, which are at present allocated for television broadcasting purposes. It is to be understood, of course, that other frequency ranges may be employed for the reception of other signals without departing from the spirit and scope of the present invention.

The output lead 26 of tuning network 25 is coupled to control grid 27 of converter 3 through blocking condenser 28. Control grid 27 is connected to ground through grid leak resistor 30. Cathode 31 of converter 3 is grounded through coil 32. An oscillation generator or "local oscillator," schematically indicated at 33, has its output connected across coil 34 which coil is inductively coupled to coil 32. Thus, oscillatory energy developed by generator 33 is impressed upon cathode 31 for converting the RF wave intercepted by antenna 1 and amplified by amplifier 2 to the intermediate frequency, as is well known. The intermediate frequency wave may be derived from output circuit 35 connected to anode 36. Subsequent portions of the receiver have not been illustrated as they form no part of the present invention and are well known to those skilled in the art.

Tuning network 25, which embodies the present invention, comprises coil 40 connected between a suitable anode voltage supply +B and anode 23 through lead 24. Coil 41 is connected in series between input lead 24 and output lead 26 of network 25. The interelectrode capacitance existing between anode 23 and cathode 20 of amplifier 2, that is, between the output electrodes of the amplifier is indicated in dotted line at 42. Capacitance 42 exists effectively between lead 24 and ground and accordingly this capacitance is in parallel with coil 40 to form therewith a parallel resonant circuit. Capacitor 43 indicated in dotted lines as connected across coil 40 represents the distributed capacitance of the coil.

The interelectrode capacitance between control grid 27 and cathode 31 of converter 3, that is, between the input electrodes of the converter is indicated in dotted lines at 44. Capacitance 44 exists effectively between lead 26 and ground, and accordingly, coil 41 and capacitor 44 form a series resonant circuit connected between lead 24 and ground.

Tuning network 25 which includes coils 40, 41 and capacitors 42, 43 and 44 can be made to resonate alternatively within two well separated frequency ranges. Network 25 is tuned by paramagnetic core 45 which is movable within either coil 40 or coil 41 as indicated schematically. A paramagnetic material is defined as a material having a magnetic permeability greater than that of a vacuum, which is unity. The magnetic permeability of a paramagnetic material may be independent of the magnetizing force or it may vary with the magnetizing force, in which case the material is called ferromagnetic. Core 45 preferably consists of comminuted powdered iron, formed in a suitable binder in accordance with conventional practice.

Figure 2:
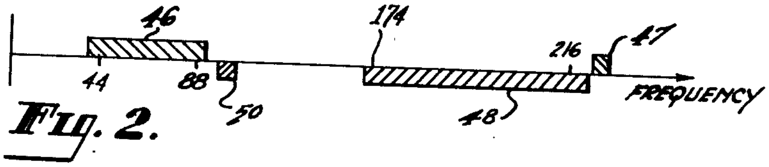
Fig. 2 is a graph illustrating the frequency responses of the tuning network illustrated in Fig. 1.

Let is be assumed that core 45 is in the position shown in full lines, that is, the core is within coil 40. Movement of core 45 within coil 40 will vary the resonant frequency of the parallel resonant circuit including coil 40 and capacitors 42, 43. The frequency response of the parallel resonant circuit may, for example, be between 44 and 88 mc. as illustrated at 46 in Fig. 2. At the same time, coil 41 and capacitor 44 will resonate at a frequency above 216 mc. as indicated at 47 in Fig. 2. The resonant frequency of series resonant circuit 41, 44 will change very little with movement of core 45 within coil 40. Coil 41 functions as a step-up transformer for a carrier wave within the frequency range between 44 and 88 mc. to which parallel resonant circuit 40, 42, 43 is tuned when core 45 moves within coil 40.

Let is now be assumed that coil 45 is in the dotted position, that is, the core moves within coil 41. In that case, the resonant frequency of the series resonant circuit 41, 44 and the reactance between lead 24 and ground is adjusted by movement of core 45. We may assume that this series resonant circuit is adjustable within the high frequency range between 174 and 216 mc. as shown at 48 in Fig. 2. At the same time, the frequency response of parallel resonant circuit 40, 42, 43 is above 38 mc. but well below 170 mc. as shown at 50 in Fig. 2.

It may be assumed that the combined capacitance of capacitors 42, 43 amounts to 10 micromicrofarads. Further, the capacitance of capacitor 44 may amount to 5 micromicrofarads. When core 45 is in the dotted position, the effective capacitance of capacitors 42, 43 is reduced by coil 40 to approximately 8 micromicrofarads. With respect to series resonant circuit 41, 44, capacitors 42, 43 in parallel and capacitor 44 are connected in series. Accordingly, the total or effective capacitance of capacitors 42, 43 and 44 arranged in series is reduced to 3 micromicrofarads. Consequently, coil 41 may be resonated by capacitors 42, 43 and 44 within a high frequency range. Coil 40 may then be considered as a choke feed for the anode voltage supply. Blocking condenser 28 prevents the direct current supplied to coil 40 from reaching control grid 27.

The circuit of Fig. 1 operates in a conventional manner. Let it be assumed that switches 7 and 11 are moved into their lower positions so that low pass filter 5 is connected between antenna 1 and amplifier 2. Low pass filter 5 may be constructed in such a manner as to cut off all frequencies above 150 mc. Let it further be assumed that core 45 is in the full line position, that is, within coil 40. By movement of core 45 with respect to coil 40, tuning network 25 may be resonated at any frequency between 44 and 88 mc. Thus, only a carrier wave intercepted by antenna 1 and amplified by amplifier 2 which falls within that frequency range will be impressed upon converter 3. Since low pass filter 5 cuts off all frequencies above 150 mc., no waves will be received which correspond to the resonant frequency of series resonant circuit 41, 44, and thus no undesired signals will be impressed upon converter 3.

When it is desired to receive a wave within the high frequency range between 174 and 216 mc., switches 7 and 11 may be thrown into their upper positions so that high pass filter 4 is now connected between antenna 1 and amplifier 2. High pass filter 4 preferably cuts off all frequencies below 130 mc. Accordingly, only waves above 130 mc. are amplified by amplifier 2. Core 45 is now moved to its dotted position. By moving core 45 with respect to coil 41 any desired wave within the high frequency range between 174 and 216 mc. may be passed by tuning network 25 and impressed upon converter 3. The low frequency response illustrated at 50, Fig. 2, of parallel resonant circuit 40, 42, 43 is well below the cut-off range of high pass filter 4 and thus no undesired signals will be received by reason of the resonant condition of the low frequency network. It is to be understood that network 25 may also be designed to respond to other high frequency ranges.

Preferably, switches 7 and 11 are actuated by common actuating means which is also operable to move core 45 from coil 40 to coil 41 or vice versa. This has been illustrated in Fig. 3. Coils 40 and 41 are preferably wound on a common coil form 60. Coils 40 and 41 should be separated from each other so that they are not magnetically coupled. Paramagnetic core 45 is movable within coil form 60 and is guided thereby in accordance with conventional practice. Core 45 is moved by string 61 which is guided over pulleys 62 and 63. Pulley 63 may be actuated by control knob 64.

Figure 3:
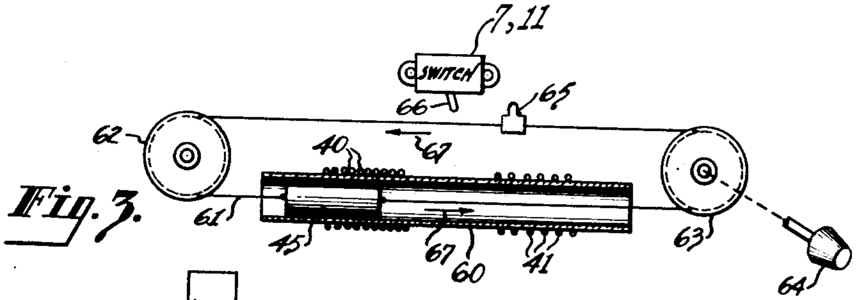
Fig. 3 is a schematic representation of the tuning and switching device of the receiver of Fig. 1 and associated coils.

String 61 is provided with an upwardly extending member 65 which is arranged to cooperate with actuating lever 66 of switches 7 and 11 which are shown schematically in Fig. 3. Both switches 7 and 11 may be actuated by one actuating lever 66. When control knob 64 is rotated to move string 61 in the direction shown by arrows 67, member 65 will eventually engage actuating lever 66 and will thereby throw switches 7 and 11. This will occur after core 45 is withdrawn from coil 40 and before it enters coil 41. Accordingly, switches 7 and 11 and tuning core 45 are actuated by common actuating means exemplified by control knob 64.

When control knob 64 is rotated in the opposite direction, member 65 will move from left to right of Fig. 3 and will return actuating lever 66 into the position shown in Fig. 3. This will occur after core 45 is withdrawn from coil 41 and before it enters coil 40.

Figure 4:
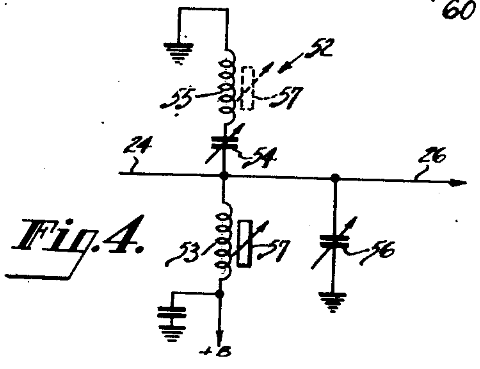
Fig. 4 is a circuit diagram of a modified tuning network in accordance with the invention.

A modification of tuning network 25 is illustrated in Fig. 4. It will be understood that the network 52 of Fig. 4 may be substituted for tuning network 25 in the circuit illustrated in Fig. 1. Tuning network 25 of Fig. 1 may be considered a three-terminal network having an input lead 24, an output lead 26 and a third lead connected to radio-frequency ground potential. Tuning network 52 of Fig. 4 may be considered a two-terminal network having a common input and output lead 24, 26 and a ground terminal. Coil 53 is connected between leads 24, 26 and ground through the anode voltage supply +B. Capacitor 54 and coil 55 are connected in series between leads 24, 26 and ground. Capacitor 56 is in parallel with coil 53, that is, between leads 24, 26 and ground. The capacitance of capacitor 54 preferably is large compared to that of capacitor 56.

The two-terminal tuning network 52 may be considered as consisting of two parallel resonant circuits. The first parallel resonant circuit may be adjusted to resonate within a low frequency range and includes coil 53, capacitor 54 and capactor 56. The second parallel resonant circuit may be adjusted to resonate within a high frequency range and includes coil 55, capacitor 54 and capacitor 56. The two parallel resonant circuits are adjusted by a single paramagnetic core 57 which may either be moved with respect to coil 53 or with respect to coil 55.

Let it be assumed that core 57 is within coil 53. In that case, tuning network 52 will resonate within its low frequency range. The inductance of coil 55 is small compared to that of coil 53 and consequently may be neglected when core 57 is within coil 53. The small capacitance of capacitor 56 may also be disregarded. The parallel resonant circuit, therefore, consists essentially of coil 53 and capacitor 54. Capacitor 54 is adjustable, as shown, for adjusting the low frequency response of the tuning network. This is preferably done when core 57 is within coil 53. Capacitor 56 is effectively in parallel with the interelectrode capacitance of tubes 2 and 3 which have been illustrated at 42 and 44 in Fig. 1. Capacitor 56 may thus be omitted if the interelectrode capacitances 42 and 44 are sufficiently large.

Let it now be assumed that core 57 is in the dotted position, that is, within coil 55. In that case, a parallel resonant circuit is formed which includes effectively only coil 55 and capacitor 56. Coil 53 now functions as a choke feed for the anode voltage supply. Since the capacitance of capacitor 54 is large, its effect may be disregarded during the high frequency operation. Tuning network 52 of Fig. 4 operates in substantially the same manner as network 25 of Fig. 1.

Network 52 may again be used in connection with a high pass filter and a low pass filter to render the undesired responses of the network ineffective. It is to be understood, however, that filters 4 and 5 are optional and may be omitted.

There has thus been described a tuning network which can be adjusted to resonate selectively within one of two separated frequency ranges which may correspond to the frequency ranges allocated for television broadcasting purposes. The network is adjusted by a single core. The network may, for example, be used between the RF amplifier and the converter stages of a superheterodyne receiver. A high pass or a low pass filter may be connected selectively between the antenna and the RF amplifier stage for rendering ineffective the undesired response of the network. The switches required for the two filters are not detrimental because they are provided in the low impedance path of the receiver between the antenna and the first RF amplifier.

What is claimed is:

1. A two band signal transfer network selectively tunable to a desired frequency within one of two substantially different high frequency ranges comprising in combination, a network input terminal, a network output terminal and a reference terminal, a pair of resonant circuits connected between said input and output terminals, each circuit having a coil and associated means connected therewith providing tuning capacitance therefor, at least one of said coils being connected between said input terminal and said reference terminal, a signal input circuit, a high pass filter and a low pass filter, means for tuning said network to a desired resonant frequency selectively within either of said different frequency ranges comprising a single paramagnetic core movable alternatively with respect to one or the other of said coils, and uni-control means for selectively connecting said filters between said signal input circuit and said network input terminal and for moving said core.

2. The combination as defined in claim 1 wherein one of said coils is connected between said network terminal and said reference terminal, and the other of said coils is connected serially in the network between said network input and output terminals.

3. In a superheterodyne receiver, an antenna for intercepting a modulated carrier wave, a carrier wave amplifier having input and output electrodes, a high pass filter and a low pass filter, switch means for selectively connecting one of said filters between said antenna and the input electrodes of said amplifier, a frequency converter having input electrodes, a network for coupling the output electrodes of said amplifier to the input electrodes of said converter, said network comprising a first coil connected between the output electrodes of said amplifier and a second coil connected between an output electrode of said amplifier and an input electrode of said converter to provide with the interelectrode capacitance of said amplifier and said converter two tuned circuits, a single paramagnetic core movable relatively to either one of said coils to resonate said network to a desired frequency within two separated frequency ranges, and unicontrol means for moving said core and for actuating said switch means when said core is moved from one of said coils to the other one of said coils.

4. In a superheterodyne receiver, an antenna for intercepting a modulated carrier wave, a carrier wave amplifier having input and output electrodes, a high pass filter and a low pass filter, switch means for selectively connecting one of said filters between said antenna and the input electrodes of said amplifier, a frequency converter having input electrodes, a network for coupling the output electrodes of said amplifier to the input electrodes of said converter, said network comprising a first coil connected between the output electrodes of said amplifier and a second coil connected between an output electrode of said amplifier and an input electrode of said converter to provide with the interelectrode capacitance of said amplifier and said converter two resonant circuits, a single paramagnetic core movable relatively to either one of said coils to resonate said network to a desired frequency within either a high or a low frequency range, said high pass filter cutting off frequencies within said low frequency ranges, said low pass filter cutting off frequencies within said high frequency range, and unicontrol means for moving said core and for actuating said switch means when said core is moved from one of said coils to the other one of said coils.

References Cited in the file of this patent

UNITED STATES PATENTS

| Number | Name | Date |
|---|---|---|
| 1,865,271 | Osmun et al. | June 28, 1932 |
| 2,094,189 | Polydoroff | Sept. 28, 1937 |
| 2,215,774 | Andreatta | Sept. 24, 1940 |
| 2,248,242 | Landon | July 8, 1941 |
| 2,282,386 | Sinninger | May 12, 1942 |
| 2,285,766 | Cutting | June 9, 1942 |
| 2,289,670 | McClellan | July 14, 1942 |
| 2,301,934 | Edwards | Nov. 17, 1942 |
| 2,370,714 | Carlson | Mar. 6, 1945 |
| 2,422,381 | White | June 17, 1947 |
| 2,427,331 | Spoor | Sept. 9, 1947 |
| 2,443,935 | Shea | June 22, 1948 |
| 2,449,148 | Sands | Sept. 14, 1948 |
| 2,470,882 | Blok | May 24, 1949 |
| 2,486,986 | Sands | Nov. 1, 1949 |
| 2,581,159 | Achenbach | Jan. 1, 1952 |